United States Patent [19]

Morich et al.

[11] Patent Number: 5,177,441
[45] Date of Patent: Jan. 5, 1993

[54] ELLIPTICAL CROSS SECTION GRADIENT OIL

[75] Inventors: Michael A. Morich, Mentor; John L. Patrick, Chagrin Falls; Labros Petropoulos, Cleveland Heights; Michael A. Martens, Euclid; Robert W. Brown, Solon, all of Ohio

[73] Assignee: Picker International, Inc., Highland Hts., Ohio

[21] Appl. No.: 719,334

[22] Filed: Jun. 21, 1991

Related U.S. Application Data

[63] Continuation-in-part of Ser. No. 368,047, Jun. 16, 1989, Pat. No. 5,036,282.

[51] Int. Cl.$^5$ ............................................. G01R 33/20
[52] U.S. Cl. .................................... 324/318; 324/309
[58] Field of Search ............... 324/300, 307, 309, 318, 324/319, 320, 322; 128/653.5; 335/219

[56] References Cited

U.S. PATENT DOCUMENTS

| 4,617,516 | 10/1986 | Schenck | 324/318 |
|---|---|---|---|
| 4,626,784 | 12/1986 | Sepponen | 324/309 |
| 4,646,024 | 2/1987 | Schenck et al. | 324/318 |
| 4,712,067 | 12/1987 | Roschmann et al. | 324/318 |
| 4,737,716 | 4/1988 | Roemer et al. | 324/319 |
| 4,737,718 | 4/1988 | Kemner et al. | 324/322 |
| 4,740,751 | 4/1988 | Misic et al. | 324/318 |
| 4,820,988 | 4/1989 | Crooks | 324/318 |
| 4,881,035 | 11/1989 | Siebold | 324/320 |
| 4,910,462 | 3/1990 | Roemer | 324/318 |
| 4,926,125 | 5/1990 | Roemer | 324/318 |

FOREIGN PATENT DOCUMENTS

| 0073399 | 8/1982 | European Pat. Off. |
| 0073402 | 9/1982 | European Pat. Off. |
| 0217520 | 8/1986 | European Pat. Off. |
| 0317853 | 1/1987 | European Pat. Off. |
| 3336694 | 4/1984 | Fed. Rep. of Germany |
| 2180943 | 4/1987 | United Kingdom |

OTHER PUBLICATIONS

Minimum Inductance Coils, J. Phys. E. Sci. Instrum 21 (1988) 948-952.
Theory and Application of Mathieu Functions, N. W. McLachlan, Dover Pub. pp. 170-177 (1964).
Active Magnetic Screening of Gradient Coils in NMR Imaging, Mansfield, et al. J. Mag Res., 66, pp. 573-576 (1986).
Active Magnetic Screening of Coils for Static and Time-Dependent Magnetic Field Generation in NMR Imaging, Mansfield, et al. J. Phys. E. Sci. Inst. 19.
Real-Time Movie Imaging from a Single Cardiac Cycle by NMR, Chapman, et al. Mag. Res. in Med. 5 pp. 246-254, (1987).
Minimum Inductance Coils, R. Turner, J. Phys. E. Sci. Inst. 21, pp. 948-952 (1988).
Gradient Coil Design for Microscope Imaging of Human Extremities in a One Meter Bore Magnet, Barlow, p. 132.

(List continued on next page.)

Primary Examiner—Michael J. Tokar

[57] ABSTRACT

An examination region (12) is defined by an elliptically crossed-section cylinder (20) of a non-conductive, non-magnetic material. The x, y, and z-gradient coils (24, 26, 22) are mounted on elliptically crossed-section cylindrical surfaces along the former for causing gradient magnetic fields within the examination region. Each of the x, y, and z-gradient coils includes a plurality of arrays or groups of coil loops. The arrays of coil loops are symmetric about a central plane of symmetry. To either side of the plane of symmetry, each of the first of the x, y, and z coil arrays (74, 80, 90) include at least a first group of loops in which current flows in a clockwise direction and a second array of loops (76, 82, 90) in which current flows in an opposite direction.

17 Claims, 4 Drawing Sheets

OTHER PUBLICATIONS

A New Method of Gradient Coil design in MRI by Fujita, et al. p. 27.

An Optimized Highly Homogeneous Shielded Gradient Coil Design, Carlson p. 28.

Coils of Minimum Inductance, R. Turner, p. 26.

Design Data for Efficient Axial Gradient Coils: Application to NMR Imaging St. James, et al. Mag. Res. in Med. 2, pp. 245-252 (1985).

Self-Shielded Gradient Coil Design via Eddy Current Modeling, F. Goldie, p. 120.

Passive Screening of Switched Magnetic Field Gradients, R. Turner, et al., J. Phys. E. Scien. Inst. 19, pp. 876-879, (1986).

A Target Field Approach to Optimal Coil Design, R. Turner, J. Phys. D. Appl. Phys. 19, pp. L147-151, (1986).

High Speed, High Field, Planar Surface Gradient Assembly for Fast Imaging Roemer, et al., p. 134.

Coils Producing a Magnetic Field Gradient for Diffusion Measurements with NMR, Zupancic, et al., J. Phy. E. Sci. Inst. vol. 9 (1976).

Magnetic Field gradient Coils for NMR Imaging, Bangert, et al., J. Phys. E. Sci. Inst. vol. 15 (1982).

A Finite Element Fourier Expansion Technique for the Design of a Pulsed Radial Gradient System for Magnetic Resonance Imaging (MRI), Pillsbury, et al., Trans. of Mag. vol. MAG21, No. 6, Nov. 1985, pp. 2273-2275.

ELLIPTICAL CROSS SECTION GRADIENT OIL

This application is a continuation in part of U.S. application Ser. No. 368,047, filed Jun. 16, 1989, now U.S. Pat. No. 5,036,282.

BACKGROUND OF THE INVENTION

The present invention relates to the art of magnetic field gradient generation. It finds particular application in conjunction with establishing gradient magnetic fields in magnetic resonance imaging techniques and will be described with particular reference thereto. It is to be appreciated, however, that the invention will also find application in spectroscopy and other processes and apparatus in which accurately predictable magnetic field gradients are established or maintained.

In magnetic resonance imaging, a uniform magnetic field is created through an examination region in which a subject to be examined is disposed. A series of radio frequency pulses and magnetic field gradients are applied to the examination region. Gradient fields are conventionally applied as a series of gradient pulses with preselected profiles. These pulses excite magnetic resonance, phase and frequency encode the resonance, and cause phase and frequency encoded magnetic resonance signals to be emitted.

More specifically, the gradient magnetic pulses are applied to select and encode the magnetic resonance. In some embodiments, the magnetic field gradients are applied to select one or more planes or slices to be imaged. Gradient field pulses are also applied for selectively modifying the uniform magnetic field to encode frequency and phase into the magnetization, hence the resonance signals in order to identify a spatial location.

The magnetic resonance signals are then processed to generate two or three dimensional image representations of a portion of the subject in the examination region. The accuracy of the resultant image representation, among other factors, is dependent upon the accuracy with which the actually applied magnetic field gradient pulses conform to selected gradient pulse profiles.

Heretofore, linear magnetic field gradients have been produced by cylindrical gradient field coils. Discrete coils were wound in a bunched or distributed fashion on a large diameter hollow right cylinder tube, commonly 65 centimeters in diameter or larger. Conventional bunched geometries include Maxwell or modified-Maxwell pairs for z-gradient production and single or multi-arc Golay saddle coils for x and y gradient production. The coils are normally wound in a series arrangement and positioned to give a magnetic field profile with the desired linearity over a predefined volume. The distributive windings on the cylinders are generally wound and in pairs and driven anti-symmetrically. The coils are driven in an anti-symmetric manner such that only odd derivatives are non-zero at the coil origin. The first derivative is the field gradient while the third and higher order derivatives represent distortion. If the diameter of the cylinder and coil placement are chosen properly, the third derivative is canceled at the origin making the relatively weak fifth derivative component the first distortion term.

The conventional gradient coils are constructed of copper rods or multi-strand wires that are wound on a fiberglass reinforced plastic tube. The inductance, which is related to the stored magnetic energy, is critical in gradient coil design. The inductance determines to how quickly the coil can switch the gradient field on and off with a given supply of voltage. Large inductances, as are typical in wound cylindrical coils, slow the switching speed of the gradient magnetic fields.

For maximum efficiency, it would be advantageous to reduce the diameter of the gradient coil cylinders to be as close as possible to the subject, provided gradient linearity can be maintained. The required energy for field gradient production varies roughly as a fifth power of a gradient coil cylinder diameter in free space. In an actual magnetic resonance imager, the gradient coils interact with other adjoining structures such as radiation shields of superconducting magnets, making the relationship somewhat greater than the fifth power. Although reducing the coil size could have a dramatic effect on power consumption, reducing the cylinder diameter below 65 centimeters would be too restrictive to receive patients for full body scans. Although less power consumptive, a single planar surface gradient coil, by contrast, suffers from poor gradient uniformity or field linearity. Images using a single planar gradient coil require geometric distortion correction for head size volumes and larger.

The gradient coils are commonly placed on a circular cylinder for simplicity of design. The symmetry of the circular cylinder renders it relatively straightforward to calculate the gradient magnetic field at any point within the cylinder that would be caused by a series of windings on the cylinder. Generally, the winding pattern is adjusted iteratively based on mathematical calculations to obtain a linear gradient within the 65 centimeter coil. Once the designed coil becomes a physical reality, it was often necessary to make further iterative adjustments on the physical coil. These iterative adjustments for gradient uniformity are often made with little or no concern for gradient coil energy storage efficiency.

It is recognized that decreasing the volume within the coil increases coil efficiency by placing sources closer to the object examined. For a generally oval human torso, an oval gradient coil would be advantageous. However, the complexity of designing gradient coil windings on an elliptical or other non-circular cylinder is so great that it has not heretofore been achieved.

U.S. Pat. No. 4,820,988, issued Apr. 11, 1989 to Crooks, et al. shows a technique for making a more elliptical y-gradient coil. Rather than face the challenges of designing an elliptical coil, Crooks takes two circular gradient coil segments, removes the side portions adjacent their intersection with an x-z plane, and moves the remaining circular arc segments closer together. The x and z coils in Crooks were still positioned on a circular cylinder. This renders the y-gradient coil more energy efficient by reducing its patient receiving volume. It might be noted that the Crooks patent recognizes and suggests that elliptical x, y, and z coils would be advantageous. However, there is no enabling disclosure of how to construct elliptical gradient coils with sufficient linearity for magnetic resonance imager use.

In accordance with the present invention, a new and improved gradient coil configuration and method of design is provided which overcomes the above-referenced problems and others.

SUMMARY OF THE INVENTION

In accordance with one aspect of the present invention, a gradient coil assembly with an elliptical transverse cross-section is provided for generating magnetic field gradients across an examination region.

In accordance with a more specific aspect of the present invention, windings are provided on an elliptical cylinder for creating gradients along three mutually orthogonal axes.

In accordance with another more limited aspect of the present invention, the windings for generating linear gradients along at least one of the axes includes first and second loop coil arrays disposed symmetrically on opposite sides of a plane of symmetry extending transversely through the cylinder. Third and fourth coil loop arrays are also mounted along the elliptical surface on opposite sides of the plane of symmetry and between the first and second coil loop arrays, respectively. A power supply supplies current to the coil loop arrays such that the first and third arrays have a net clockwise current flow and the second and third arrays have a net counterclockwise current flow.

In accordance with a still more limited aspect of the present invention, four analogous coil loop arrays are disposed along an opposite surface of the elliptical cylinder. The four analogous coil loop arrays are again disposed symmetrically around the plane of symmetry and have the current flowing therein in opposite directions.

In accordance with another aspect of the present invention, a gradient coil assembly is mounted on a generally elliptical surface. The coil is designed by determining current flux densities and patterns along the elliptical surface which (a) minimizes stored magnetic energy in the elliptical gradient coil and (b) produces a preselected gradient most closely, e.g. a linear gradient.

In accordance with another aspect of the present invention, a magnetic resonance imaging apparatus is provided which has an elliptical gradient coil assembly.

One advantage of the present invention is that it minimizes stored magnetic energy.

Another advantage of the present invention is that it provides for rapid on and off switching times.

Yet another advantage of the present invention is that it minimizes coil volume and improves coil efficiency.

Still other advantages of the present invention will become apparent to those of ordinary skill in the art upon reading and understanding the preceding detailed description.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENT

Figure 1:
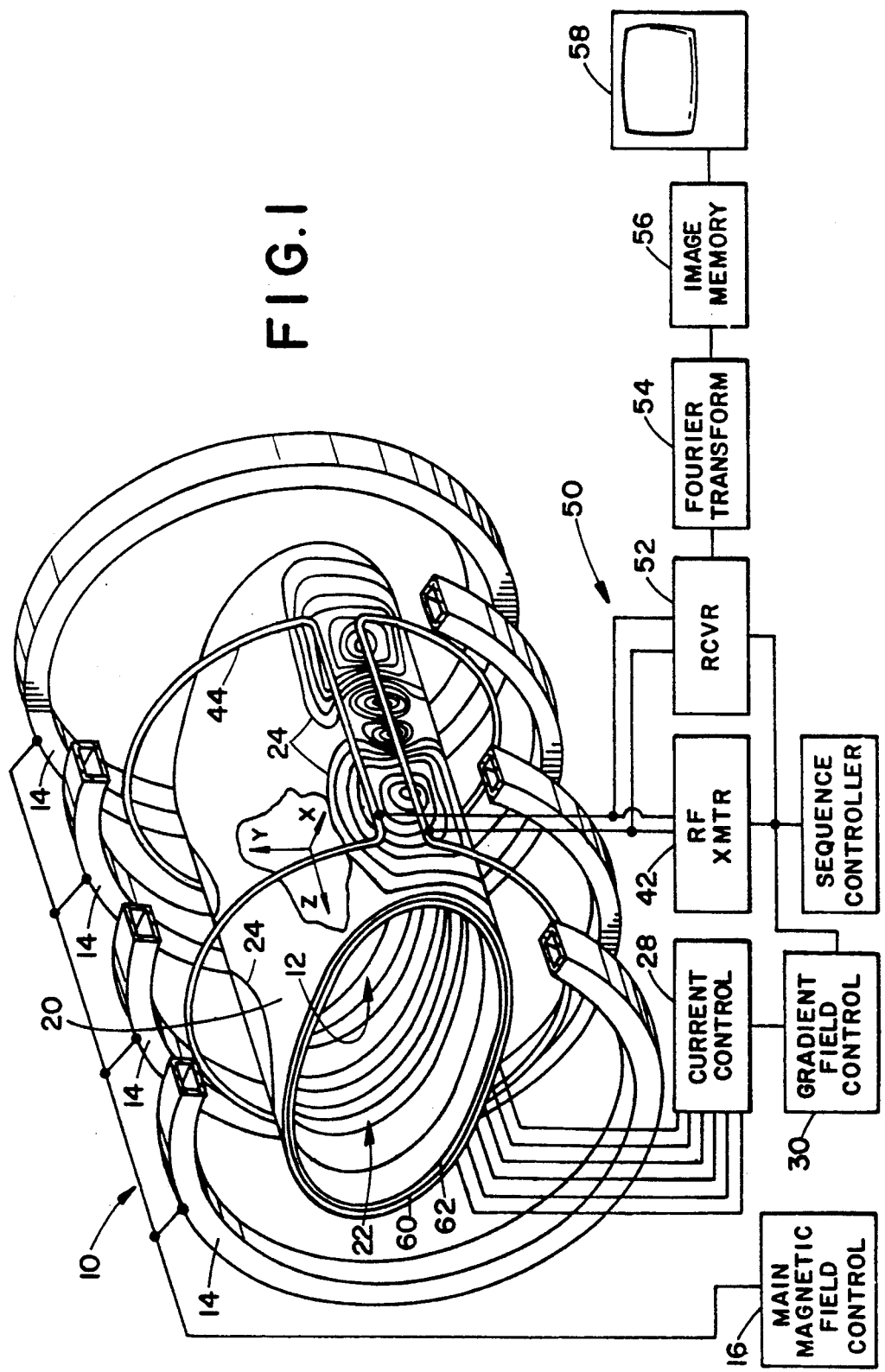
FIG. 1 is a diagrammatic illustration of a magnetic resonance imaging apparatus with a magnetic field gradient coil in accordance with the present invention.

With reference to FIG. 1, a main magnetic field means 10 generates a substantially uniform magnetic field longitudinally through an examination region 12. The main magnetic field means includes a plurality of main field magnets 14 which are operated under control of a magnetic field control means and power supply 16. Preferably, the main magnetic field is a strong, uniform field that is aligned with a z or longitudinal axis.

An elliptical gradient magnetic field means 20 selectively creates gradient magnetic fields across the examination region 12. The gradient field means includes a z-gradient coil assembly 22 which applies or creates magnetic field gradients along the z-axis. An x-gradient coil assembly 24 selectively applies or creates magnetic field gradients in an x direction transverse to the z-axis and along the major axis of the elliptical gradient magnetic field means in the illustrated embodiment. A y-gradient coil assembly 26 selectively applies or causes magnetic field gradients in a y direction, transverse to the x and z-axes and along the minor of the ellipse.

Each of the x, y, and z-gradient coil assemblies include a plurality of symmetrically arranged windings or coil loops. A current control means 28 selectively supplies electrical current to each loop of the x, y, and z-gradient coils. The current is supplied to the current loops such that the current flows through some of the loops of each coil assembly in a first or clockwise direction and through other loops of the same assembly in an opposite or counterclockwise direction. A gradient field control means 30 controls the current control means 28 to cause it to apply appropriate current pulses to the gradient field windings to cause selected gradient pulses.

A resonance excitation means 40 includes a radio frequency transmitter 42 for generating radio frequency pulses of the appropriate frequency spectrum for inducing resonance in selected dipoles disposed in the examination region. The radio frequency transmitter is connected to a radio frequency antenna 44 disposed adjacent the examination region for transmitting radio frequency pulses into a region of interest of the patient or other subject in the examination region. Although the radio frequency antenna is illustrated as being disposed peripherally around the gradient coil assemblies, it is to be appreciated that such antenna may also be disposed within the gradient coil assemblies. For example, a surface coil may be positioned contiguous to an examined patient or subject for controllably inducing magnetic resonance in a selected contiguous region of the patient.

A magnetic resonance receiving means 50 includes the radio frequency coil 44 which receives, as well as transmits, radio frequency signals in the illustrated embodiment. For other studies, separate transmit and receive coils are used. For example, receive only surface coils may be disposed contiguous to a selected region of the patient to receive resonance signals induced by the radio frequency coil 44. A radio frequency receiver 52 receives the radio frequency signals from the antenna 44. The received radio frequency signals are demodulated and reconstructed into an image representation. More specifically, a Fourier transform means 54 performs an inverse two-dimensional fast Fourier transform on the magnetic resonance signals to transform them into an image representation for storage in an image memory means 56. As is conventional in the art, the image may represent a planar slice through the patient, an array of parallel planar slices, a three dimensional volume, or the like. A display means 58, such as a video monitor, provides a man-readable display of the resultant image. Other conventional processing equipment, which is conventional in the art, is omitted from the illustration for simplicity.

The elliptical gradient coil 20, in the preferred embodiment, includes two elliptical formers 60, 62 made of a non-magnetic and non-conducting material. The two elliptical formers or sleeves are configured relative to each other such that they nest snugly together. Two of the coils are formed on opposite surfaces of the same elliptical cylinder or former and the third coil is formed on the other. Alternately, one of the surfaces may be covered with a smooth insulator and the third coil formed on that.

As illustrated in Table 1 below, reducing the gradient coil from a 55 centimeter circle to an ellipse reduces the energy stored in it. More specifically, when the gradient coil has a single constraint, that of a linearly varying changing gradient field in the z direction over a 10 centimeter region, the energy stored in the coil in joules is 0.74 joules for the circle, 0.49 joules for an ellipse with a major axis 2a of 55 centimeters and a minor axis 2b of 45 centimeters, and only 0.41 joules for an elliptical cross-section with a major axis of 55 centimeters and a minor axis of 40 centimeters. In the next column, when the gradient field is further constrained to be constant in both the x and y directions, the stored energy increases. However, as can be seen in the percentage reduction columns, the ellipse with the 45 centimeter minor axis stores 19% less energy than the circular cross-section coil and the 40 centimeter minor axis ellipse cross-section coil stores 36% less energy than the circular cross-section coil.

| Geometry | ENERGY IN JOULES | | % Reduced From Circle | | |
|---|---|---|---|---|---|
| | ONE Constraint 15 mT/m | THREE Constraints vertical, horizontal at 10 cm | ONE | THREE | Volume Change |
| Circle 55 cm | 0.74 | 1.20 | — | — | — |
| Ellipse (55 cm × 45 cm) | 0.49 | 0.97 | 34% | 19% | 18% |
| Ellipse (55 cm × 40 cm) | 0.41 | 0.76 | 45% | 36% | 27% |

More specifically, the optimal current density distribution $J_\theta(Z)$ is computed to yield minimum stored energy $W_m$ for the desired magnetic field pattern $B_z$ by way of the following equations:

$$G(\bar{x},\bar{x}') = 2 \sum_{r=0}^{\infty} \int_{-\infty}^{\infty} dk_2 e^{ik_2(z-z')} [ce_r(\theta,-q)ce_r(\theta',-q)(s'_r)^{-2}Ce_r(\mu_<,-q) \quad (1)$$

$$Fek_r(\mu_>,-q) + se_r(\theta,-q)se_r(\theta',-q)(p'_r)^{-2}Se_r(\mu_<,-q)Gek_r(\mu_>,-q)]$$

where $$s'_{2r+1} = (-1)^r se'_{2r+1}(0,q)se_{2r+1}\left(\frac{\pi}{2},q\right)/kB_1^{(2r+1)}$$

$$p'_{2r+1} = (-1)^{r+1}ce_{2r+1}(0,q)ce'_{2r+1}\left(\frac{\pi}{2},q\right)/kA_1^{(2r+1)}$$

$$J(k_2) = -\frac{2i}{a^2\pi^2} \sum_{r=\text{odd}}^{\infty} \sum_{j=1}^{N} \lambda_j \frac{\sin(k_2 z_j)}{\eta_j^2 - \cos^2\theta_j} \left[ (B_1^{(r)})(Fek_r(\eta_0))(s'_r)_j^{-2} \sqrt{\eta_0^2 - 1} \; E_j + \right. \quad (2)$$

$$\left. (A_1^{(r)})(Gek_r(\eta_0))(p'_r)_j^{-2}\eta_0 H_j \right] / \left( \sum_{r=\text{odd}}^{\infty} D \right)$$

and $$J_\theta(z) = \frac{4}{a^2\pi^2} \int_0^{\infty} dk_2 \sin k_2 z J(k_2) \quad (3)$$

$$B_{zi} = \frac{\mu_0}{4\pi} \frac{16}{a^2} \int_{-\infty}^{\infty} dk_2 \sum_{r=\text{odd}}^{\infty} \frac{\sin(k_2 z_i)}{\eta_i^2 - \cos^2\theta_i} \left[ (B_1^{(r)})(Fek_r(\eta_0))(s'_r)_i^{-2} \sqrt{\eta_0^2 - 1} \; E_1 + \right. \quad (4)$$

$$\left. (A_1^{(r)})(Gek_r(\eta_0))(p'_r)_i^{-2}\eta_0 H_i \right] \cdot \left( \sum_{j=1}^{N} \lambda_1 \frac{\sin(k_2 z_j)}{\eta_j^2 - \cos^2\theta_j} \left( (B_1^{(r)})(Fek_r(\eta_0))(s'_r)_j^{-2} \sqrt{\eta_0^2 - 1} \; E_j + \right.\right.$$

$$\left.\left. (A_1^{(r)})(Gek_r(\eta_0))(p'_r)_j^{-2}\eta_0 H_j)\right) / \left( \sum_{r=\text{odd}}^{\infty} D \right)$$

$$W_m = \frac{\mu_0}{4\pi} \frac{8}{a^2} \int_{-\infty}^{\infty} dk_2 \left[ \sum_{r=\text{odd}}^{\infty} \sum_{j=1}^{N} \lambda_j \frac{\sin(k_2 z_j)}{\eta_j^2 - \cos^2\theta_j} \left( (B_1^{(r)})(Fek_r(\eta_0))(s'_r)_j^{-2} \sqrt{\eta_0^2 - 1} \; E_j + \right. \right. $$

$$\left. \left. (A_1^{(r)})(Gek_r(\eta_0))(p'_r)_j^{-2} \eta_0 H_j \right) \right]^2 / \left( \sum_{r=\text{odd}}^{\infty} D \right) \quad (5)$$

where $E_1 = ce_r(\theta_1)\cos\theta_1(\eta_1^2 - 1)Ce'_r(\eta_1) - ce'_r(\theta_1)\sin\theta_1 \eta_1 Ce_r(\eta_1)$ $H_1 = se_r(\theta_1)\sin\theta_1 \eta_1 \sqrt{\eta_1^2 - 1} \; Se'_r(\eta_1) + se'_r(\theta_1)\cos\theta_1 \sqrt{\eta_1^2 - 1} \; Se_r(\eta_1)$ $D = Ce_r(\eta_0)Fek_r(\eta_0)(\eta_0^2 - 1)(s'_r)^{-2}(B_1^{(r)})^2 + Se_r(\eta_0)Gek_r(\eta_0)\eta_0^2(p'_r)^{-2}(A_1^{(r)})^2$ These equations represent a Green function for the elliptic cylindrical geometry and the solutions for the elliptic z-gradient coil. In them, $\lambda_j$ are the solved for Lagrange multipliers, $B_z(x_i, y_i, z_i)$ is the magnetic flux density at points $x_i, y_i, z_i$, $W_m$ is the stored magnetic energy $J(k_2)$ is the Fourier transform of the current density $J_\theta(Z)$. The equations can be easily adapted for production of x and y-gradient fields/coils.

Figure 2:
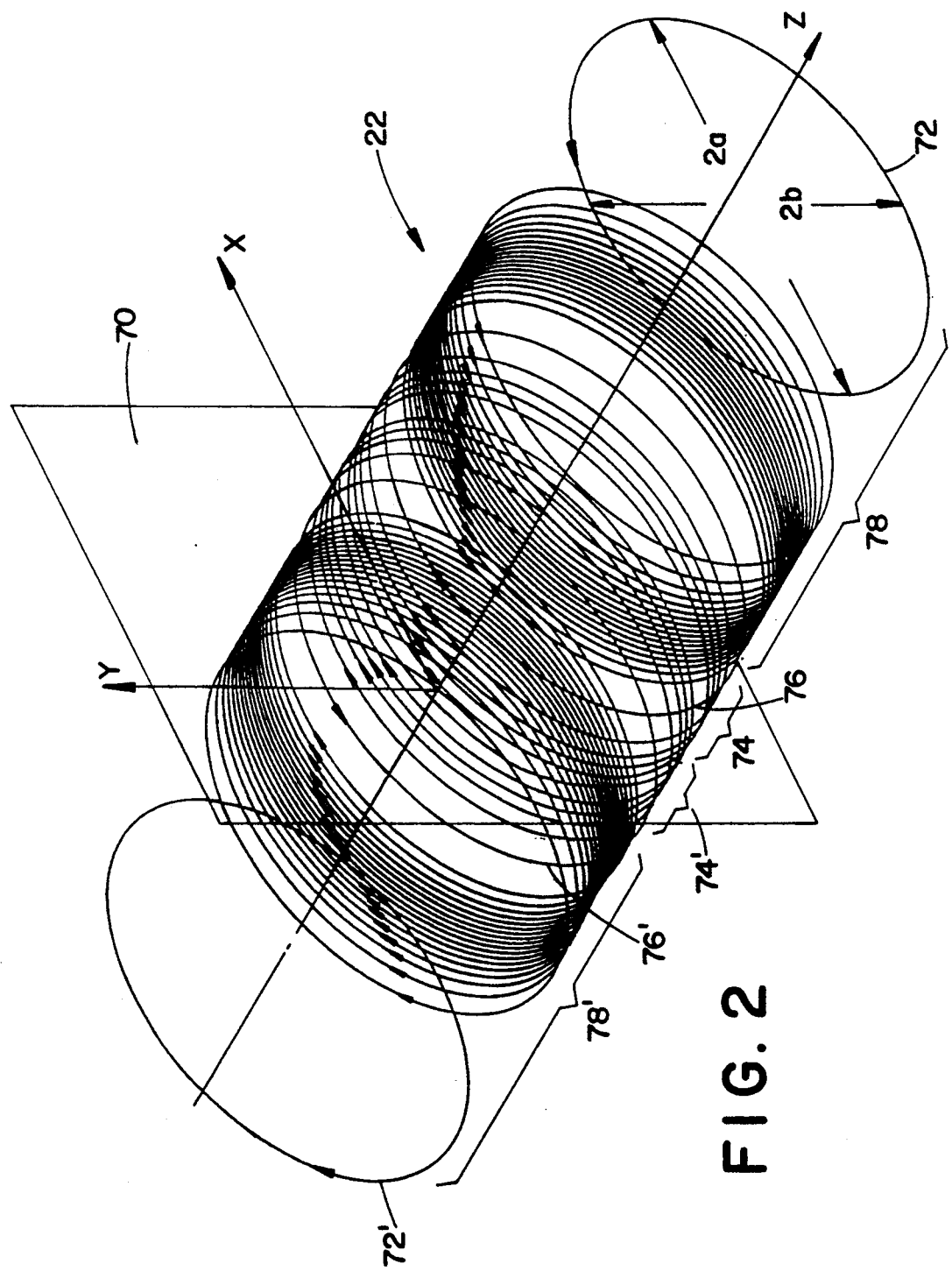
FIG. 2 illustrates a preferred z-gradient coil assembly winding pattern in accordance with the present invention.

With reference to FIG. 2, an x-y plane of symmetry 70 marks the center of the z-gradient coil 22. Loops of the z-gradient coil are distributed along the elliptical surface from the central plane 70 to edge loops 72, 72'. The exact number of loops will vary with the precision to which equations (1)-(5) are solved. Twenty-four loops to either side of the symmetric plane are used in the illustrated embodiment. More specifically, in a first four loop array 74 on one side of the symmetric plane, current flows in first direction. In a mirror image four loop array 74', which is mirror imaged to the other side of the symmetric plane, current flows in an opposite, second direction. In a third loop array 76 adjacent the first loop array 74, the current flows in the second direction, i.e. contrary to the neighboring first four loop array 74. Analogously, symmetrically on the other side of the symmetric plane 70, a fourth loop array 76' has current that flows in the first direction, i.e. opposite to the second loop array 76'. In a fifth loop array 78 adjacent the third loop array, the current flows in the first direction, i.e. the same as in the first loop array 74. In a sixth loop array 78' that is mirror imaged about the plane of symmetry from the fifth loop array, the current flows in the second direction, i.e. the same as the second loop array and opposite to the fourth loop array. In the illustrated embodiment, each current loop receives the same amount of current from the current control 28 and the spacing between the loops is adjusted to provide a current density dictated by solving equations (1)-(5). Of course, the loops may have a constant spacing and different current magnitudes to achieve the same identified current densities.

It will be noted that the constraints in the x, y, and z direction are not symmetric due to the elliptical cross-section. This lack of symmetry creates an artifact that is cancelled by the flip flop of the current direction in loops 76, 76'.

Coils in the x and y direction are again determined by solving equations analogous to equations (1)-(5) but with different constraints, i.e. a linearly changing gradient in the x or y direction, respectively, and constant in the other directions.

Figure 3:
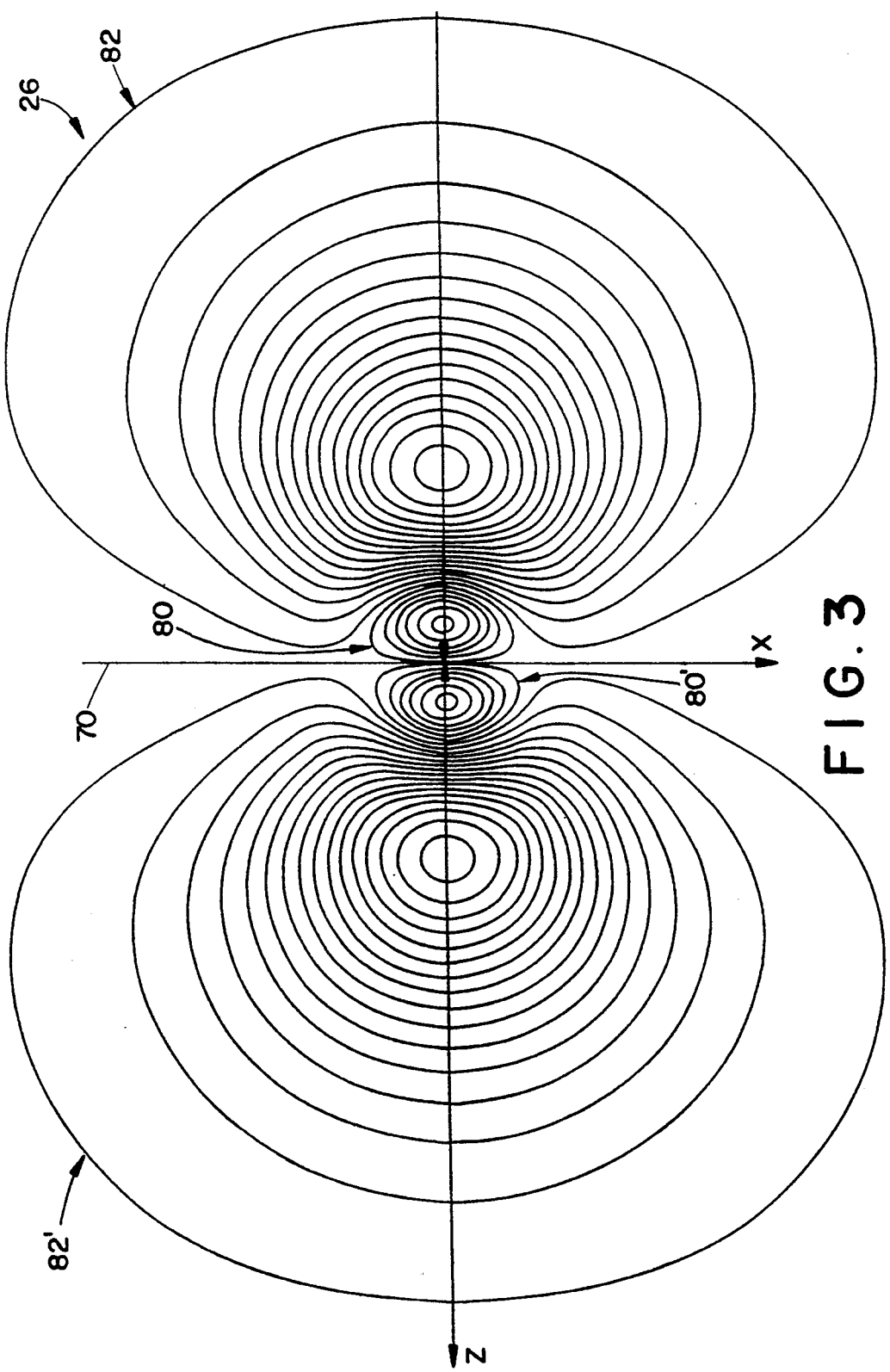
FIG. 3 illustrates a planar projection of a y-gradient coil assembly winding pattern in accordance with the present invention.

With reference to FIG. 3, the y-gradient coil is again symmetric about the plane of symmetry 70 and about a y-z plane. A first loop array 80 and a second loop arrangement 80' are disposed symmetrically about the plane of symmetry. Third and fourth coil loops arrays 82 and 82' and are also disposed symmetrically about the plane of symmetry. The first and second coil loop arrays correct for irregularities in the gradient generated by the third and fourth loop arrays, respectively. Additional loop arrays can be disposed symmetrically about the plane of symmetry to provide second and higher order corrections. The current control means 28 applies electrical currents to the coils such that the current in the first and second coil loop arrays is in the opposite directions, e.g. first and second directions. The current control means further applies currents to the third and fourth coil arrays such that the current flows in opposite directions relative to each other and in an opposite direction relative to the closest one of the first and second coil loop arrays. Specifically, the first coil loop array has a first direction current, the second and third coil loop arrays have second direction currents, and the fourth coil loop array has first direction current. A like set of y-gradient coil arrays is disposed on the opposite side of the elliptical former mirror imaged about an x-z plane.

Figure 4:
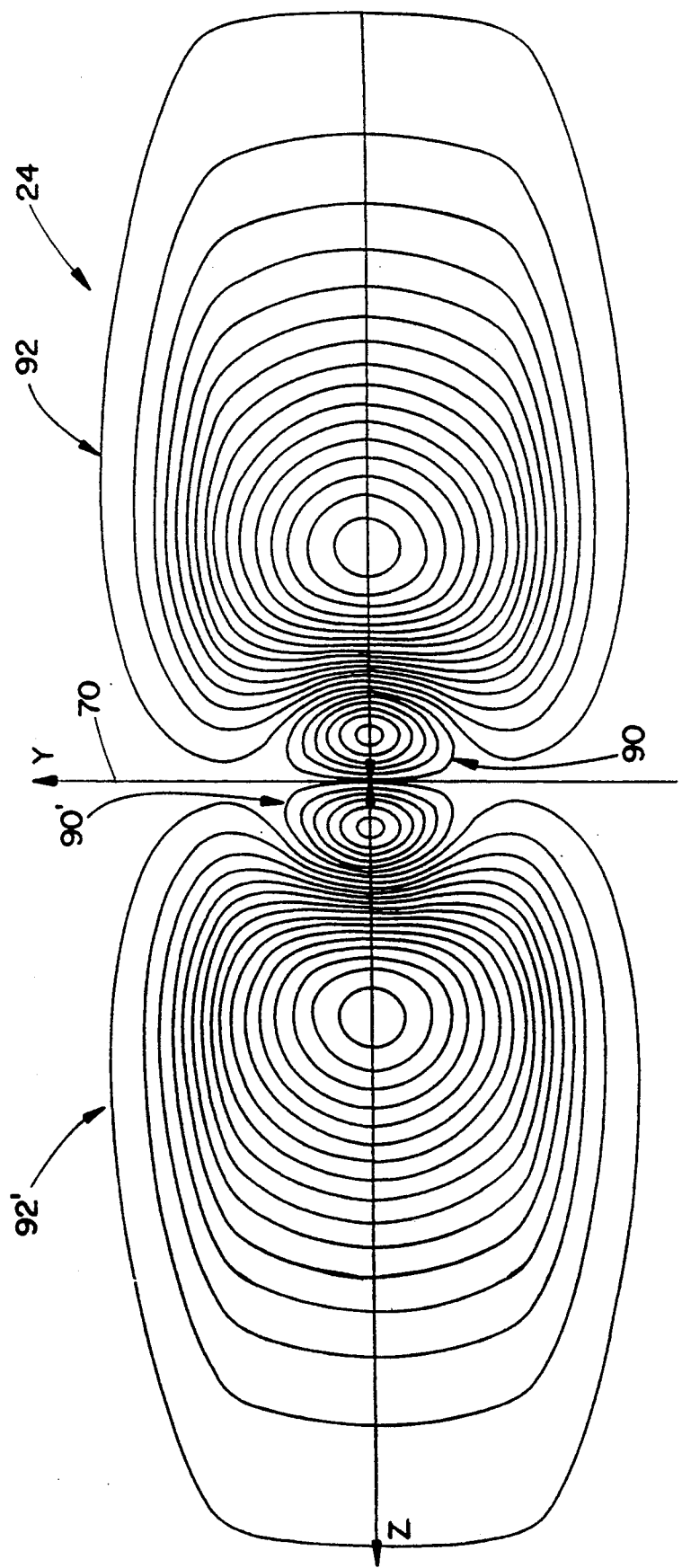
FIG. 4 illustrates a planar projection of an x-gradient coil assembly winding pattern in accordance with the present invention.

FIG. 4 illustrates an exemplary coil winding pattern for the x-gradient. The x-gradient coil is again wrapped around and on the surface of one of the elliptical formers. The x-gradient coil again has first and second coil loop arrays 90, 90' that are disposed symmetrically to either side of the plane of symmetry 70 and about the x-z plane. Third and fourth coil arrays 92, 92' are disposed symmetric to the plane of symmetry and the x-z plane. The first and second coil arrays which are smaller and closer to the plane of symmetry than the third and fourth coil loop arrays correct for non-linearities in the gradient generated by the third and fourth coil arrays, respectively. A like set of four coil arrays is disposed on an opposite side of the major axis of the ellipse mirror image about the y-z plane.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus comprising:
- a main magnetic field means for generating a main magnetic field longitudinally through an examination region generally parallel to a longitudinal z axis, the examination region having a generally elliptical cross-section with an x axis being defined along a major axis of the elliptical cross-section and a y axis being defined perpendicular to the x and z axes along a direction parallel to a minor axis of the elliptical cross section;
- a magnetic field gradient means for generating magnetic field gradients across the examination region, the gradient magnetic field means including:
    - first and second coil loop arrays disposed symmetrically on opposite sides of an x-y plane of symmetry and along an elliptical cross-section cylindrical surface surrounding the examination region,
    - third and fourth coil loop arrays disposed symmetrically about the x-y plane of symmetry along the elliptical cylindrical surface and more remote from the plane of symmetry than the first and second coil loop arrays, respectively, the third and fourth coil loop arrays further being disposed symmetric relative to at least one of an x-z plane and a y-z plane,
    - a current supply means for supplying electric current to the coil loop arrays such that the first and third coil loop arrays disposed to a first side of the plane of symmetry have net current flows in opposite directions and such that the second and fourth coil loop arrays disposed to a second side of the plane of symmetry have net current flow in opposite directions;
- a magnetic resonance excitation means for selectively exciting magnetic resonance dipoles disposed in the examination region;
- a magnetic signal receiving means for receiving magnetic resonance signals from the resonating dipoles; and,
- a reconstruction means for reconstructing an image representation from the magnetic resonance signals.

2. The magnetic resonance imaging apparatus as set forth in claim 1 wherein the first, second, and third coil loop arrays extend peripherally around the elliptical cylinder, generally parallel to the x-y plane of symmetry.

3. The magnetic resonance imaging apparatus as set forth in claim 2 wherein the first and third coil loop arrays have a net clockwise current flow and the second and fourth coil loop arrays have a net counterclockwise current flow.

4. The magnetic resonance imaging apparatus as set forth in claim 3 further including a fifth coil loop array disposed adjacent the third coil loop array and a sixth coil loop array disposed adjacent the fourth coil loop array, the fifth coil loop array having a net clockwise current flow and the sixth coil loop array having a net counterclockwise current flow.

5. The magnetic resonance imaging apparatus as set forth in claim 4 wherein the elliptical cylindrical surface has a height to width ratio of about 55:45.

6. The magnetic resonance imaging apparatus as set forth in claim 4 wherein the generally elliptical cylindrical surface has a height to width ratio between 1:1 and about 55:40.

7. The magnetic resonance imaging apparatus as set forth in claim 4 wherein the first, second, third, fourth, fifth, and sixth coil loop arrays create a magnetic field gradient within the elliptical examination region which is constant along the x and y axes and which varies linearly along the z axis.

8. The magnetic resonance imaging apparatus as set forth in claim 7 wherein the magnetic field gradient is constant along the x and y axes and linearly varying along the z axis over a region that has a length to width to height ratio of about 10:55:45.

9. The magnetic resonance imaging apparatus as set forth in claim 7 wherein the magnetic field gradient is uniform along the x and y axes and linearly varying along the z axis over a region that has a length to width to height ratio of about 10:55:40.

10. The magnetic resonance imaging apparatus as set forth in claim 1 wherein the magnetic field gradient means further includes an x-gradient magnetic field means for generating a gradient which varies generally linearly along the x axis and is substantially constant along the y and z axes, the x-gradient magnetic field means including:
- first and second x-gradient coil loop arrays disposed symmetrically on the opposite sides of the plane of symmetry and lying on the generally elliptical cross section cylindrical surface, each of the first and second x-gradient coil loop arrays being disposed symmetrically relative to an x-z plane,
- third and fourth x-gradient coil loop arrays disposed symmetrically on the opposite side of the plane of symmetry and more remote than the first and second x-gradient coil loop arrays along the elliptical cylindrical surface, the third and fourth x-gradient coil loop arrays each being symmetric relative to the x-z plane,
- the current supply means supplying electric current to the x-gradient coil loop arrays such that the first and third x-gradient coil loop arrays disposed to the first side of the plane of symmetry have net current flows in opposite directions and the second and fourth x-gradient coil loop arrays have net current flows in opposite directions.

11. The magnetic resonance imaging apparatus as set forth in claim 10 wherein the magnetic field gradient means further includes an y-gradient magnetic field means for generating a gradient which varies generally linearly along the y axis and is substantially constant along the x and z axes, the y-gradient magnetic field means including:
- first and second y-gradient coil loop arrays disposed symmetrically on the opposite sides of the plane of symmetry and lying on a generally elliptical cylindrical surface, each of the first and second y-gradient coil loop arrays being disposed symmetrically relative to a y-z plane,
- third and fourth y-gradient coil loop arrays disposed symmetrically on the opposite sides of the plane of symmetry and more remote than the first and second y-gradient coil loop arrays along the elliptical cylindrical surface, the third and fourth coil loop arrays each being symmetric relative to the y-z plane,
- the current supply means supplying electric current to the y-gradient coil loop arrays such that the first and third y-gradient coil loop arrays have net current flows in opposite directions and the second and third y-gradient coil loop arrays have net current flows in opposite directions.

12. The magnetic resonance imaging apparatus as set forth in claim 1 wherein the magnetic field gradient means further includes an y-gradient magnetic field means for generating a gradient which varies generally linearly along the y axis and is substantially constant along the x and z axes, the y-gradient magnetic field means including:
first and second y-gradient coil loop arrays disposed symmetrically on the opposite sides of the plane of symmetry and lying on a generally elliptical cylindrical surface, each of the first and second y-gradient coil loop arrays being disposed symmetrically relative to a y-z plane,
third and fourth y-gradient coil loop arrays disposed symmetrically on the opposite sides of the plane of symmetry and more remote than the first and second y-gradient coil loop arrays along the elliptical cylindrical surface, the third and fourth coil loop arrays each being symmetric relative to the y-z plane,
the current supply means supplying electric current to the y-gradient coil loop arrays such that the first and third y-gradient coil loop arrays have net current flows in opposite directions and the second and third y-gradient coil loop arrays have net current flows in opposite directions.

13. A magnetic resonance apparatus comprising:
a main magnetic field means for generating a main magnetic field along a z axis through an examination region;
an elliptical z-gradient coil assembly having coil windings extending peripherally around an elliptically cross-sectioned cylinder, the coil windings being disposed symmetrically on opposite sides of a plane of symmetry defined perpendicular to the z axis;
a current supply means for supplying electrical current to the coil windings such that the majority of coil windings on a first side of the plane of symmetry have a net current flow in first direction around a periphery of the elliptically cross-sectional cylinder and at least one of the windings on the first side of the plane of symmetry has a net current flow in a second direction opposite to the first direction and such that the majority of the coil windings on a second side of the plane of symmetry have a net current flow in the second direction and at least one of the coil windings on the second side of the plane of symmetry has a net current flow in the first direction;
a resonance excitation means for selectively exciting dipoles in the examination region to resonance; and,
a magnetic resonance receiving means for receiving radio frequency magnetic signals emanating from the examination region.

14. The magnetic resonance apparatus as set forth in claim 13 further including a x-gradient coil assembly having windings disposed generally along the elliptical cylinder for creating x-gradient magnetic fields which are constant along the z axis and an y axis and which vary linearly along an x axis, the x, y, and z axes being mutually orthogonal.

15. The magnetic resonance apparatus as set forth in claim 13 further including a y-gradient coil assembly having windings disposed generally along the elliptical cylinder for creating y-gradient magnetic fields which are constant along the z axis and an x axis and which vary linearly along a y axis, the x, y, and z axes being mutually orthogonal.

16. The magnetic resonance apparatus as set forth in claim 15 further including a x-gradient coil assembly having windings disposed generally along the elliptical cylinder for creating x-gradient magnetic fields which are constant along the z axis and the y axis and which vary linearly along the x axis.

17. An elliptical gradient coil for a magnetic resonance apparatus, the gradient coil comprising:
a non-magnetic, non-conductive cylindrical former having a generally elliptical cross-section transverse to its central axis;
a first winding array extending peripherally around the elliptical former to a first side of a plane of symmetry, which plane of symmetry is orthogonal to the central axis;
a second winding array disposed to a second side of the plane of symmetry symmetric with the first winding array;
a third winding array extending peripherally around the elliptical former and disposed adjacent the first winding array on the first side of the plane of symmetry;
a fourth winding array disposed symmetric to the third winding array on the second side of the plane of symmetry;
a fifth winding array extending peripherally around the elliptical former and disposed on the first side of the plane of symmetry more remote than the third winding array;
a sixth winding array disposed on the second side of the plane of symmetry symmetrically to the fifth winding array;
a current supply means for supplying current to the first, fourth, and fifth winding array in a first direction and to the second, third, and sixth winding array in a second direction opposite to the first direction.

* * * * *

UNITED STATES PATENT AND TRADEMARK OFFICE
CERTIFICATE OF CORRECTION

PATENT NO. : 5,177,441

DATED : January 5, 1993

INVENTOR(S) : Morich, et al

It is certified that error appears in the above-identified patent and that said Letters Patent is hereby corrected as shown below:

On the title page, item [54] and in column 1, lines 2 and 3, the title should read --ELLIPTICAL CROSS SECTION GRADIENT COIL--.

Signed and Sealed this

Ninth Day of November, 1993

Attest:

*Attesting Officer*

BRUCE LEHMAN

*Commissioner of Patents and Trademarks*